(12) United States Patent
Komatsu et al.

(10) Patent No.: US 7,586,317 B2
(45) Date of Patent: Sep. 8, 2009

(54) INSPECTION APPARATUS, PROBE CARD AND INSPECTION METHOD

(75) Inventors: Shigekazu Komatsu, Yamanashi (JP); Dai Shinozaki, Tokyo (JP); Katsuaki Sakamoto, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/174,014

(22) Filed: Jul. 16, 2008

(65) Prior Publication Data

US 2009/0021272 A1  Jan. 22, 2009

(30) Foreign Application Priority Data

Jul. 20, 2007  (JP) ............... 2007-189500

(51) Int. Cl.
*G01R 1/073* (2006.01)
(52) U.S. Cl. ...................... 324/754; 324/757
(58) Field of Classification Search .................. None
See application file for complete search history.

(56) References Cited

U.S. PATENT DOCUMENTS

| 6,529,011 | B1 | 3/2003 | Okubo | |
|---|---|---|---|---|
| 6,777,967 | B2 * | 8/2004 | Iino et al. | 324/757 |
| 7,061,259 | B2 * | 6/2006 | Iino et al. | 324/756 |
| 7,262,613 | B2 * | 8/2007 | Komatsu et al. | 324/754 |
| 7,301,357 | B2 * | 11/2007 | Shinozaki et al. | 324/757 |
| 2004/0174177 | A1 | 9/2004 | Iino et al. | |
| 2007/0063725 | A1 * | 3/2007 | Komatsu et al. | 324/765 |

FOREIGN PATENT DOCUMENTS

| EP | 1574866 A1 | 9/2005 |
|---|---|---|
| EP | 1939640 A2 | 7/2008 |

OTHER PUBLICATIONS

European Search Report for EP 08012480 dated Oct. 6, 2008.

* cited by examiner

*Primary Examiner*—Vinh P Nguyen
(74) *Attorney, Agent, or Firm*—Pearne & Gordon LLP

(57) ABSTRACT

By allowing an electrical conduction between a probe and an electrode by a fritting phenomenon before inspection, simplification of circuit configuration and shortening of inspection time is achieved. A fritting circuit is formed in a probe card of an inspection apparatus for each probe pair consisting of two probes. A capacitor is connected to each fritting circuit. Each fritting circuit is connected in parallel to a power supply circuit having a charging power supply. Each capacitor is charged at one time by the power supply circuit. The probe pair is brought into contact with an electrode of a wafer, and a high-voltage is applied to the probe pair by a power charged in the capacitor, thereby achieving an electrical connection between each probe and the electrode by a fritting phenomenon. Then, an inspection of electrical characteristics is performed by using an electric inspection signal transmitted to each probe.

13 Claims, 3 Drawing Sheets

INSPECTION APPARATUS, PROBE CARD AND INSPECTION METHOD

FIELD OF THE INVENTION

The present disclosure relates to an inspection apparatus for inspecting electrical characteristics of a target object; a probe card; and an inspection method performed by using the inspection apparatus or the probe card.

BACKGROUND OF THE INVENTION

Inspection of electrical characteristics of an electric circuit such as an IC, an LSI, or the like formed on a semiconductor wafer has been performed by using an inspection apparatus. The inspection apparatus includes a probe card electrically connected with a tester, and the probe card has a number of probes disposed on its bottom surface. The inspection of the electric circuit is carried out by bringing the probes into contact with respective electrodes of the electric circuit on the wafer and applying electric signals to the electrodes.

However, if an oxide film is formed on a surface of the electrodes, it may interfere with the flow of the electric signals, resulting in an inspection failure. Further, if the probes are forcibly pressed against the surface of the electrodes to allow an electrical conduction between the probes and the electrodes, it is highly likely that the probes or the electric circuit will be damaged. To solve this problem, there is proposed a method involving the steps of bringing each pair of probes (a probe pair) into contact with corresponding one of the electrodes at a low pressure before starting the inspection; applying a high voltage between the probes in each pair to thereby generate a dielectric breakdown on the surface of the electrodes by a fritting phenomenon (hereinafter, referred to as "fritting"); and thus achieving a good electrical conduction between the probes and the electrodes (see, for example, Patent Documents 1 to 3). Here, the fritting phenomenon refers to a phenomenon in which an electric current flows in a surface of a metal on which an oxide film is formed, as a result of the dielectric breakdown of the oxide film by means of applying a potential gradient ranging from about $10^5$ to $10^6$ V/cm to the surface of the metal.

However, since a great number of electrodes are formed on the wafer to be inspected, hundreds to thousands of probe pairs are mounted on the probe card. Further, for the fritting process, a high-voltage power needs to be supplied to the probe pairs.

Conventionally, the supply of power to the probe pairs has been performed either by connecting a power supply to each probe pair individually or connecting a plurality of the probe pairs to a single power supply. In the latter case, connection to the power supply is switched from one probe pair to another in sequence.

[Patent Document 1]
Japanese Patent Laid-open Publication No. 2005-5331

[Patent Document 2]
Japanese Patent Laid-open Publication No. 2002-139542

[Patent Document 3]
Japanese Patent No. 3642456

In the former case, however, since the power supply needs to be provided for each of more than hundreds of probe pairs individually, the size and the price of a circuit for fritting increase. Further, in the latter case, since the great number of probe pairs need to be connected to the single power supply in sequence, it takes a very long time to complete the inspection.

BRIEF SUMMARY OF THE INVENTION

In view of the foregoing, the present disclosure provides an inspection apparatus, a probe card and an inspection method, capable of simplifying a circuit configuration for fritting, while shortening inspection time.

In accordance with one aspect of the present disclosure, there is provided an inspection apparatus for inspecting an electrical characteristic of a target object by bringing a probe into contact with a terminal of the target object, the apparatus including: a probe pair consisting of two probes; a plurality of fritting circuits, each having a charging/discharging unit connected to the probe pair and applying a voltage to the probe pair by a power of the charging/discharging unit while the probe pair is in contact with the terminal of the target object, thereby achieving an electrical connection between the probes and the terminal of the target object by using a fritting phenomenon; and a power supply circuit connected to the plurality of fritting circuits, for charging the charging/discharging unit of each fritting circuit. Further, the charging/discharging unit may be a capacitor.

In accordance with the present disclosure, each charging/discharging unit of the plurality of fritting circuits are charged at one time by the power supply circuit, and a high voltage can be applied to each probe pair by the power of the charging/discharging unit. In such case, it is not required to install a power supply for every fritting circuit, so that the circuit configuration for fritting can be simplified. Moreover, since each of the charging/discharging units is charged at one time and the fritting can be performed in each of the fritting circuits at the same time, an inspection time can be reduced.

It may be possible that the plurality of fritting circuits are connected in parallel to the power supply in the power supply circuit, and a resistor for suppressing an electrical conduction between the fritting circuits is provided in the power supply circuit.

Further, it may be possible that a switching element for turning on and off an electric connection between the charging/discharging unit and the probe pair is connected to each fritting circuit.

Further, it may be possible that an inspection circuit for transmitting an electric signal for inspection to the probes is connected to each fritting circuit, and a switching element for turning on and off an electrical connection between the fritting circuit and the inspection circuit is provided at a connection portion.

In accordance with another aspect of the present disclosure, there is provided a probe card including a plurality of probes on a surface facing a target object, for inspecting an electrical characteristic of the target object by bringing the probes into contact with a terminal of the target object, the probe card including: a probe pair consisting of two probes; a plurality of fritting circuits, each having a charging/discharging unit connected to the probe pair and applying a voltage to the probe pair by a power of the charging/discharging unit while the probe pair is in contact with the terminal of the target object, thereby achieving an electrical connection between the probes and the terminal of the target object by using a fritting phenomenon; and a power supply circuit connected to the plurality of fritting circuits, for charging the charging/discharging unit of each fritting circuit. Further, the charging/discharging unit may be a capacitor.

It may be possible that the plurality of fritting circuits are connected in parallel to a power supply in the power supply circuit, and a resistor for suppressing an electrical conduction between the fritting circuits is provided in the power supply circuit.

Further, it may be possible that a switching element for turning on and off an electric connection between the charging/discharging unit and the probe pair is connected to each fritting circuit.

Further, it may be possible that an inspection circuit for transmitting an electric signal for inspection to the probes is connected to each fritting circuit, and a switching element for turning on and off an electrical connection between the fritting circuit and the inspection circuit is provided at a connection portion.

In accordance with still another aspect of the present disclosure, there is provided an inspection method for inspecting an electrical characteristic of a target object, which is performed by using the inspection apparatus or the probe card, the method including: charging each charging/discharging unit of a plurality of fritting circuits by a power supply circuit; applying a voltage to a probe pair of each fritting circuit by a power of the charging/discharging unit after bringing the probe pair into contact with a terminal of the target object, thereby achieving an electrical connection between the probe pair and the terminal of the target object by a fritting phenomenon; and sending an electric signal for inspection to the probe pair while the probe pair is in contact with the terminal of the target object, thereby performing an inspection of the electrical characteristic of the target object.

It may be possible that the charging/discharging unit is charged during a time period after one inspection using the electric signal for inspection is completed and before a next inspection is started.

In accordance with the present disclosure, the circuit configuration for fritting is simplified and the price of the circuit is lowered. Moreover, since fritting can be performed for a number of terminals of an inspection target object at the same time, an inspection time can be reduced.

BRIEF DESCRIPTION OF THE DRAWINGS

The disclosure may best be understood by reference to the following description taken in conjunction with the following figures.

DETAILED DESCRIPTION OF THE INVENTION

Figure 1:
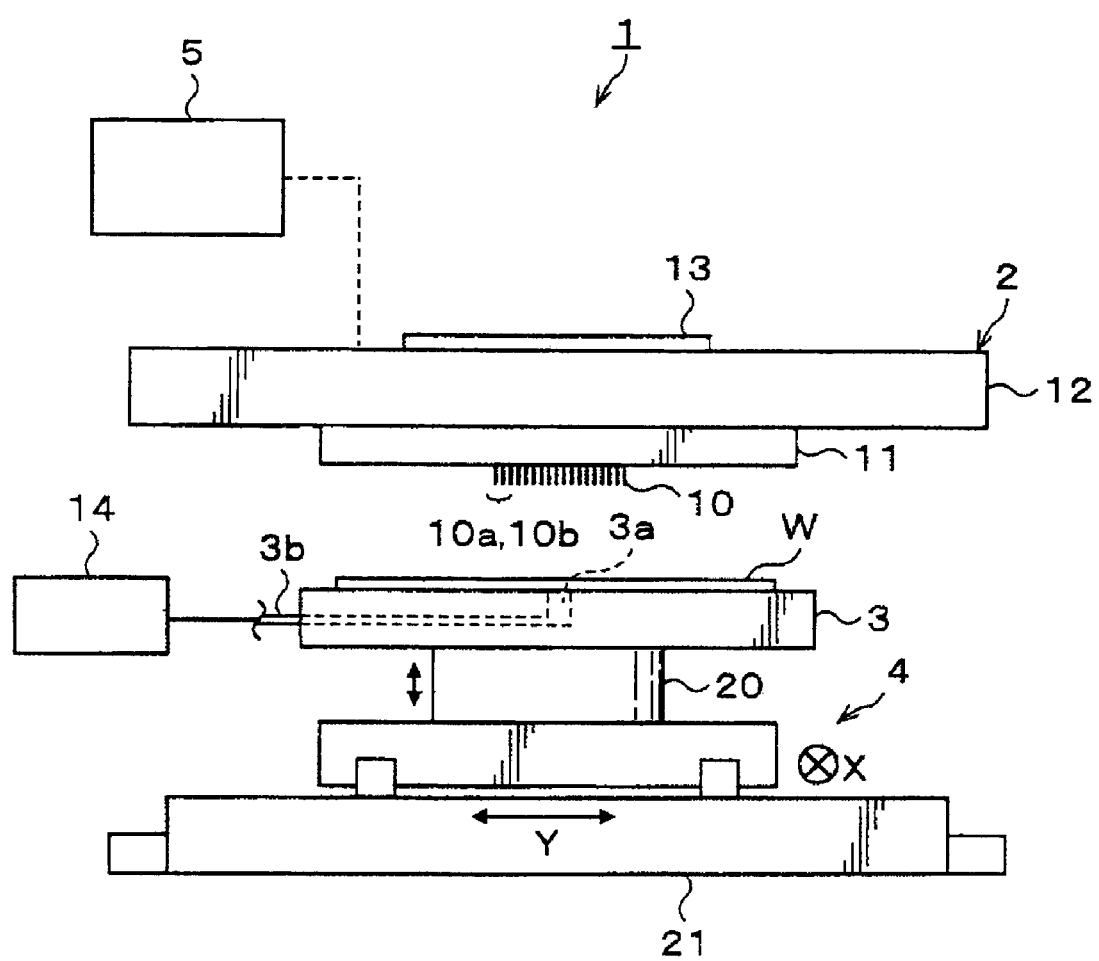
FIG. 1 provides a side view for describing a schematic configuration of an inspection apparatus.

Hereinafter, an embodiment of the present invention will be described. FIG. 1 illustrates a configuration of an inspection apparatus 1 in accordance with the embodiment of the present invention.

The inspection apparatus 1 includes, for example, a probe card 2, a chuck 3 for attracting and holding a wafer W to be inspected, a moving mechanism 4 for moving the chuck 3, a tester 5 and the like.

The probe card 2 includes, for example, a contactor 11 having more than hundreds of probes 10 supported on a bottom surface thereof; a printed circuit board 12 disposed on a top surface of the contactor 11; and a power supply board 13 disposed on a top surface of the printed circuit board 12. Each probe 10 is electrically connected to the printed circuit board 12 through a main body of the contactor 11. The tester 5 is electrically connected to the probe card 2, and an electric signal for inspecting electrical characteristics can be transceived between the tester 5 and each probe 10 via the probe card 2. Detailed circuit configuration of the printed circuit board 12 and the power supply board 13 will be described later.

The chuck 3 is of a substantially circular plate shape having a horizontal top surface, and a suction port 3a for suctioning the wafer W is provided in the top surface of the chuck 3. The suction port 3a is connected to, for example, a suction pipe 3b communicating with an external negative pressure generating unit 14 through the inside of the chuck 3.

The moving mechanism 4 includes, for example, an elevation driving mechanism 20 such as a cylinder for moving the chuck 3 upward and downward; and an X-Y stage 21 for moving the elevation driving mechanism 20 in two horizontally perpendicular directions (X and Y directions). By the moving mechanism 4, the wafer W sustained on the chuck 3 can be moved three-dimensionally, so that each electrode on the surface of the wafer W can be brought into contact with a specific probe 10 located above.

Figure 2:
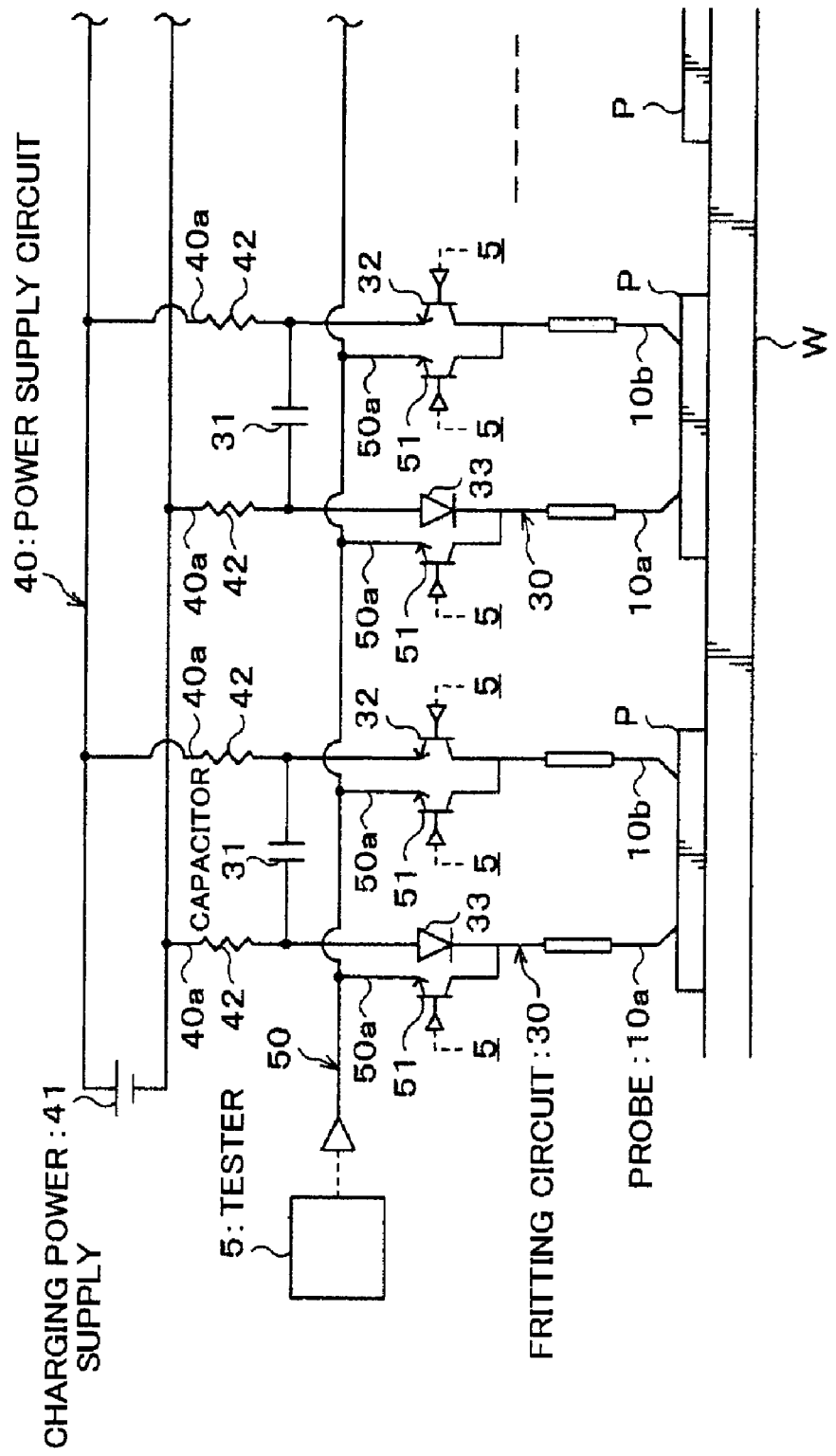
FIG. 2 sets forth a schematic circuit diagram for illustrating a fritting circuit, a power supply circuit and an inspection circuit.

Now, the circuit configuration of the printed circuit board 12 and the power supply board 13 will be explained. FIG. 2 illustrates an example circuit configuration of the printed circuit board 12 and the power supply board 13.

Among the plurality of probes 10 of the probe card 2, every two neighboring probes make a probe pair 10a and 10b. A fritting circuit 30 is formed in the printed circuit board 12 for each probe pair 10a and 10b, for example. Both ends of the fritting circuit 30 are respectively connected to the probes 10a and 10b, for example, and a capacitor 31, a switching element 32 and a diode 33 are connected in series between the probes 10a and 10b.

The capacitor 31 can store therein a power for applying a high voltage no less than about 3 V between the probes 10a and 10b. The capacitance of the capacitor 31 ranges from about 10 μF to 470 μF. The switching element 32 can turn on and off an electric connection between the capacitor 31 and the probe pair 10a and 10b. The operation of the switching element 32 can be controlled by, for example, a fritting starting/stopping signal from the tester 5. The fritting circuit 30 is formed for each probe pair 10a and 10b of the probe card 2. That is, a multiplicity of fritting circuits 30 is formed in the printed circuit board 12.

The fritting circuits 30 are all connected to a power supply circuit 40 of the power supply board 13. The power supply circuit 40 includes, for example, a charging power supply 41, and the capacitor 31 of each fritting circuit 30 is connected to the charging power supply 41 in parallel. The capacitors 31 of the plurality of fritting circuits 30 can be charged at one time by the charging power supply 41 of the power supply circuit 40. Further, a resistor 42 of about 1 kΩ to 20 kΩ is provided on a connection line 40a between the power supply circuit 40 and each capacitor 31. By providing the resistors 42, it is possible to suppress the electrical conduction between the fritting circuits 30 through the power supply circuit 40.

Connected to each fritting circuit 30 is an inspection circuit 50 which is coupled to the tester 5. The inspection circuit 50 sends an electric signal for inspection to the probes 10a and 10b through each fritting circuit 30. Provided on connection lines 50a between the inspection circuit 50 and each fritting circuit 30 are switching elements 51 which turn on and off the electric connection of the inspection circuit 50 and the fritting circuit 30 with the probes 10a and 10b. The operation of the switching elements 51 can be controlled by, for example, a test starting/stopping signal from the tester 5.

Now, a process sequence for inspecting electrical characteristics of a wafer W, which is performed by the inspection apparatus 1 having the above-described configuration, will be described.

First, the charging power supply 41 of the power supply circuit 40 is operated, whereby each capacitor 31 of all the fritting circuits 30 of the probe card 2 is charged, for example. Then, the wafer W is attracted to and held on the chuck 3 as illustrated in FIG. 1, and the wafer W on the chuck 3 is moved upward by the moving mechanism 4, so that each probe pair 10a and 10b comes into contact with one of electrodes P on the wafer W, as shown in FIG. 2. Here, as illustrated in FIG. 3, for example, each probe pair 10a and 10b comes into contact with each electrode P in a first region R1 on the wafer W.

Once each probe pair 10a and 10b makes contact with each electrode P in the first region R1, the switching element 32 shown in FIG. 2 is turned on, so that the probe pair 10a and 10b is electrically coupled to the capacitor 31. As a result, a high voltage is applied to between the probes 10a and 10b by the power charged in the capacitor 31, and is then applied to the surface of the electrode P, causing a dielectric breakdown of an oxide film on the surface of the electrode P due to a fritting phenomenon, thereby allowing the probes 10a and 10b and the electrode P to be electrically connected.

Thereafter, the switching element 32 is turned off, while the switching elements 51 are turned on, for example, so that the inspection circuit 50 and the probes 10a and 10b are electrically connected. Thereafter, an electric signal for inspection is sent from the tester 5 to each of the probes 10a and 10b via the inspection circuit 50, and inspection of electrical characteristics of electronic circuits in the first region R1 on the wafer W is performed.

Figure 3:
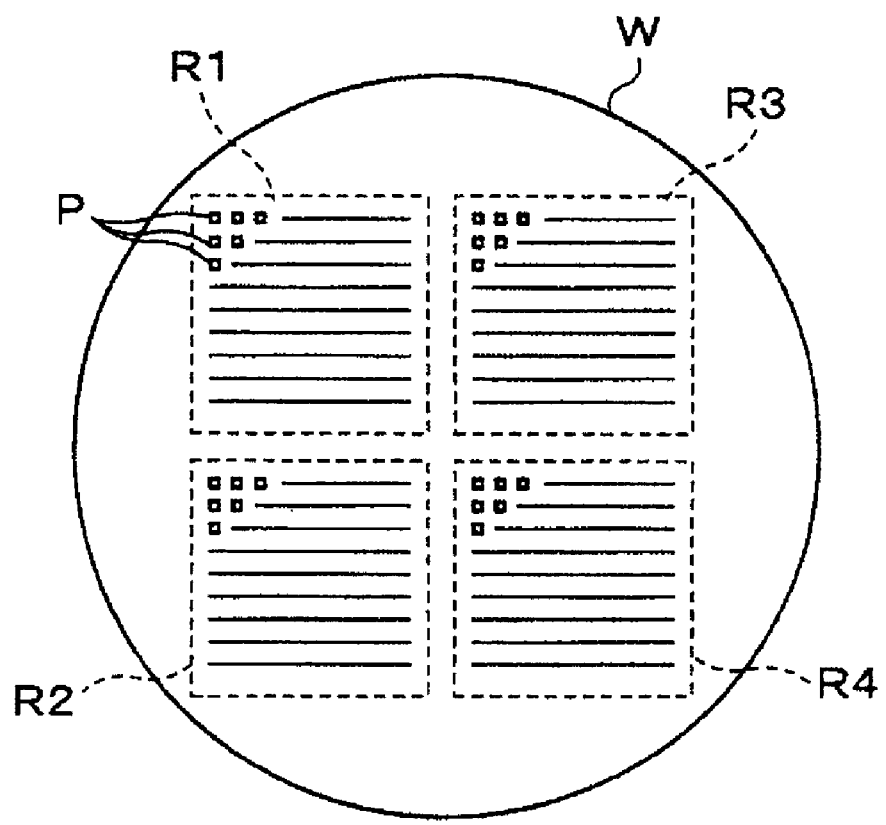
FIG. 3 presents a plan view for showing example inspection areas of a wafer.

Upon the completion of the inspection of the electrical characteristics of the first region R1, the switching elements 51 are turned off, and the wafer W is moved by the chuck 3, and each probe pair 10a and 10b is brought into contact with each electrode P in a second region R2 of the wafer W, as shown in FIG. 3. For example, during the movement between the inspection regions, the capacitor 31 of each fritting circuit 30 is charged by the charging power supply 41 of the power supply circuit 40. Thereafter, as described above, a high voltage is applied between the probes 10a and 10b of each probe pair by the power from the capacitor 31, so that the fritting is performed on the electrodes P in the second region R2. Then, an electric signal for inspection is sent to each of the probes 10a and 10b through the inspection circuit 50, whereby inspection of electrical characteristics of electronic circuits in the second region R2 is carried out. In this way, the inspections of electronic circuits in a plurality of regions R1 to R4 on the wafer W are carried out sequentially. While each region is inspected, the capacitors 31 are charged. After the electronic circuits in all the regions R1 to R4 are inspected, the wafer W is separated from the chuck 3, so that the inspection process is completed.

In accordance with the embodiment of the present invention described above, the inspection apparatus 1 has a configuration in which each fritting circuit 30 is formed for every probe pair 10a and 10b, and each fritting circuit 30 has the capacitor 31 and is connected to the power supply circuit 40. In this configuration, the capacitor 31 of each fritting circuit 30 can be charged by the single power supply circuit 40, and the fritting by the probe pair 10a and 10b can be performed by the power from the capacitor 31. Thus, the circuit configuration for the fritting can be simplified. Furthermore, since the charging of the multiplicity of capacitors 31 can be performed at the same time by the power supply circuit 40 and the fritting by each probe pair 10a and 10b can be conducted at the same time, the inspection time can be shortened.

Moreover, since the resistor 42 is connected to each connection line 40a of the power supply circuit 40, an outflow of currents from one fritting circuit 30 to another via the connection line 40a can be suppressed during the fritting process. Thus, it is possible to stabilize a voltage level of each fritting circuit 30. Furthermore, it can also be prevented that an electric inspection signal from the inspection circuit 50 to one fritting circuit 30 flows into another fritting circuit 30 via the connection line 40a. As a result, the fritting in each fritting circuit 30 and the inspection by the electric inspection signal can be appropriately performed.

Since the switching element 32 is provided in each fritting circuit 30, the fritting, which is conducted by supplying power from each capacitor 31 to each probe pair 10a and 10b, can be performed at a specific timing. Further, since the switching elements 51 are provided on the connection lines 50a between the inspection circuit 50 and each fritting circuit 30, the changeover between the fritting operation and the inspection operation can be appropriately performed.

In the above-described embodiment of the present invention, the inspection of each of the regions R1 to R4 on the wafer W are carried out sequentially, and the capacitors 31 are charged while the probes 10a and 10b are moved between the regions R1 to R4. Therefore, no waiting time is required for the charging of the capacitors 31, so that the inspection time can be further reduced. Moreover, the inspection regions on the wafer W are not limited to the mentioned examples R1 to R4. It may be also possible to perform the inspection of electrical characteristics on a chip unit after dicing the wafer W. In such case, the capacitors 31 may be charged while the chips are exchanged.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention. For example, in the present embodiment, though the power supply circuit 40 is formed in the power supply board 13 on the printed circuit board 12, it may be formed at other part within the inspection apparatus 1, for example, within the printed circuit board 12. Moreover, the target object inspected by the inspection apparatus 1 may be one having general semiconductor devices such as transistors, as exemplified in the present embodiment, or one having power devices such as a power transistor, a power MOSFET (Metal-Oxide Semiconductor Field Effect Transistor), an IGBT (Insulated Gate Bipolar Transistor), and the like.

The present invention has many advantages when it is applied to an inspection apparatus for inspecting electrical characteristics of a target object because it has a simple circuit configuration and is capable of reducing inspection time.

The scope of the present invention is defined by the following claims rather than by the detailed description of the embodiment. It shall be understood that all modifications and embodiments conceived from the meaning and scope of the claims and their equivalents are included in the scope of the present invention.

What is claimed is:

1. An inspection apparatus for inspecting an electrical characteristic of a target object by bringing a probe into contact with a terminal of the target object, the apparatus comprising:

a probe pair consisting of two probes;

a plurality of fritting circuits, each having a charging/discharging unit connected to the probe pair and applying a voltage to the probe pair by a power of the charging/discharging unit while the probe pair is in contact with the terminal of the target object, thereby achieving an electrical connection between the probes and the terminal of the target object by using a fritting phenomenon; and a power supply circuit connected to the plurality of fritting circuits, for charging the charging/discharging unit of each fritting circuit.

2. The inspection apparatus of claim 1, wherein the charging/discharging unit is a capacitor.

3. The inspection apparatus of claim 1, wherein the plurality of fritting circuits are connected in parallel to a power supply in the power supply circuit, and a resistor for suppressing an electrical conduction between the fritting circuits is provided in the power supply circuit.

4. The inspection apparatus of claim 1, wherein a switching element for turning on and off an electric connection between the charging/discharging unit and the probe pair is connected to each fritting circuit.

5. The inspection apparatus of claim 1, wherein an inspection circuit for transmitting an electric signal for inspection to the probes is connected to each fritting circuit, and a switching element for turning on and off an electrical connection between the fritting circuit and the inspection circuit is provided at a connection portion.

6. A probe card including a plurality of probes on a surface facing a target object, for inspecting an electrical characteristic of the target object by bringing the probes into contact with a terminal of the target object, the probe card comprising:

a probe pair consisting of two probes;

a plurality of fritting circuits, each having a charging/discharging unit connected to the probe pair and applying a voltage to the probe pair by a power of the charging/discharging unit while the probe pair is in contact with the terminal of the target object, thereby achieving an electrical connection between the probes and the terminal of the target object by using a fritting phenomenon; and a power supply circuit connected to the plurality of fritting circuits, for charging the charging/discharging unit of each fritting circuit.

7. The probe card of claim 6, wherein the charging/discharging unit is a capacitor.

8. The probe card of claim 6, wherein the plurality of fritting circuits are connected in parallel to a power supply in the power supply circuit, and a resistor for suppressing an electrical conduction between the fritting circuits is provided in the power supply circuit.

9. The probe card of claim 6, wherein a switching element for turning on and off an electric connection between the charging/discharging unit and the probe pair is connected to each fritting circuit.

10. The probe card of claim 6, wherein an inspection circuit for transmitting an electric signal for inspection to the probes is connected to each fritting circuit, and a switching element for turning on and off an electrical connection between the fritting circuit and the inspection circuit is provided at a connection portion.

11. An inspection method for inspecting an electrical characteristic of a target object, which is performed by using the inspection apparatus of claim 1, the method comprising:

charging each charging/discharging unit of a plurality of fritting circuits by a power supply circuit;

applying a voltage to a probe pair of each fritting circuit by a power of the charging/discharging unit after bringing the probe pair into contact with a terminal of the target object, thereby achieving an electrical connection between the probe pair and the terminal of the target object by a fritting phenomenon; and sending an electric signal for inspection to the probe pair while the probe pair is in contact with the terminal of the target object, thereby performing an inspection of the electrical characteristic of the target object.

12. The inspection method of claim 11, wherein the charging/discharging unit is charged during a time period after one inspection using the electric signal for inspection is completed and before a next inspection is started.

13. An inspection method for inspecting an electrical characteristic of a target object, which is performed by using the probe card of claim 6, the method comprising:

charging each charging/discharging unit of a plurality of fritting circuits by a power supply circuit;

applying a voltage to a probe pair of each fritting circuit by a power of the charging/discharging unit after bringing the probe pair into contact with a terminal of the target object, thereby achieving an electrical connection between the probe pair and the terminal of the target object by a fritting phenomenon; and sending an electric signal for inspection to the probe pair while the probe pair is in contact with the terminal of the target object, thereby performing an inspection of the electrical characteristic of the target object.

\* \* \* \* \*